United States Patent
Yu et al.

(10) Patent No.: US 10,942,393 B2
(45) Date of Patent: Mar. 9, 2021

(54) LIGHT SOURCE ASSEMBLY, BACKLIGHT MODULE AND DISPLAY DEVICE

(71) Applicants: BOE Technology Group Co., Ltd., Beijing (CN); Beijing BOE Optoelectronics Technology Co., Ltd., Beijing (CN)

(72) Inventors: Lu Yu, Beijing (CN); Junjie Ma, Beijing (CN); Xuerong Wang, Beijing (CN); Caizheng Zhang, Beijing (CN); Jian Sang, Beijing (CN); Haiwei Sun, Beijing (CN); Xue Dong, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/758,577

(22) PCT Filed: Sep. 18, 2017

(86) PCT No.: PCT/CN2017/102142
§ 371 (c)(1),
(2) Date: Mar. 8, 2018

(87) PCT Pub. No.: WO2018/149128
PCT Pub. Date: Aug. 23, 2018

(65) Prior Publication Data
US 2020/0233267 A1 Jul. 23, 2020

(30) Foreign Application Priority Data
Feb. 16, 2017 (CN) .......................... 201710084336.4

(51) Int. Cl.
*G02F 1/13357* (2006.01)
*F21V 8/00* (2006.01)

(52) U.S. Cl.
CPC ....... *G02F 1/133606* (2013.01); *G02B 6/003* (2013.01); *G02B 6/0031* (2013.01);
(Continued)

(58) Field of Classification Search
CPC ......... G02F 1/133606; G02F 1/133611; G02F 2001/133607; G02F 1/133603; F21V 5/04;
(Continued)

(56) References Cited

U.S. PATENT DOCUMENTS 6,547,423 B2 * 4/2003 Marshall ................... F21V 5/04
257/E33.072
8,740,427 B2 * 6/2014 Fritz .................... B60Q 1/2665
362/494

(Continued)

FOREIGN PATENT DOCUMENTS

| CN | 1488956 A | 4/2004 |
|----|-----------|--------|
| CN | 1504803 A | 6/2004 |

(Continued)

OTHER PUBLICATIONS

International Search Report and Written Opinion for PCT Application PCT/CN2017/102142 dated Dec. 26, 2017.
(Continued)

*Primary Examiner* — Peggy A Neils
(74) *Attorney, Agent, or Firm* — Fay Sharpe LLP

(57) ABSTRACT

A light source assembly, a backlight module, and a display device are provided in the field of display technology. The light source assembly includes a light source and a collimator. The collimator is arranged on a side of the light source where a light-emergent surface is located. When light emit-
(Continued)

ted from the light source is incident on a preset surface of the collimator, a first included angle is formed between the light and the light-emergent surface. When the light is emitted out of the preset surface, a second included angle is formed between the light and the light-emergent surface. The first included angle is less than the second included angle, and the amount of light incident on per unit area of the preset surface is greater than a preset light amount threshold.

19 Claims, 8 Drawing Sheets

(52) U.S. Cl.
CPC ...... *G02B 6/0068* (2013.01); *G02F 1/133611* (2013.01); *G02F 2001/133607* (2013.01)

(58) Field of Classification Search
CPC .... G02B 6/0068; G02B 6/003; G02B 6/0031; G02B 19/0061; G02B 19/0066
See application file for complete search history.

(56) References Cited

U.S. PATENT DOCUMENTS

| | | | |
|---|---|---|---|
| 9,057,807 B2* | 6/2015 | Yoo | G02B 6/003 |
| 10,641,442 B2* | 5/2020 | Kang | F21V 17/005 |
| 2009/0231846 A1 | 9/2009 | Nakajima | |
| 2015/0108510 A1* | 4/2015 | Urano | H01L 33/62 |
| | | | 257/88 |
| 2020/0124834 A1* | 4/2020 | Woodgate | G02B 19/0061 |

FOREIGN PATENT DOCUMENTS

| | | |
|---|---|---|
| CN | 101091133 A | 12/2007 |
| CN | 101802681 A | 8/2010 |
| CN | 102081290 A | 6/2011 |
| CN | 106764708 A | 5/2017 |

OTHER PUBLICATIONS

Chinese Office Action for Chinese Application No. 201710084336.4 dated Mar. 15, 2018.

* cited by examiner

LIGHT SOURCE ASSEMBLY, BACKLIGHT MODULE AND DISPLAY DEVICE

This application is a 371 of PCT/CN2017/102142 files Sep. 18, 2017, which claims priority to Chinese Patent Application No. 201710084336.4, filed with the State Intellectual Property Office on Feb. 16, 2017 and titled "LIGHT SOURCE ASSEMBLY, BACKLIGHT MODULE AND DISPLAY DEVICE," the entire contents of which are incorporated herein by reference.

TECHNICAL FIELD

The present disclosure relates to the field of display, and in particular, to a light source assembly, a backlight module and a display device.

BACKGROUND

A display device comprises a backlight module and a display panel. The backlight module comprises a light source and a light guide plate. The light source is arranged at one side of the light guide plate and the light guide plate is arranged on a light-incident side of the display panel. The light source can emit light around. Light incident in the light guide plate is uniformly incident on the display panel under the action of the light guide plate, thereby illuminating the display panel, and further enabling the display panel to display images.

In the related art, in order to perform privacy protection on privacy information displayed on the display panel, a collimator is usually arranged between the light source and the light guide plate. A section of the collimator that is parallel to the light-emergent surface of the light source is regularly polygonal or orbicular. The collimator can collimate the light emitted from the light source, that is, the collimator can change the light emitted from the light source to be in a direction perpendicular to the light-emergent surface (i.e., perpendicular to the display panel), thereby eliminating the light exiting from two sides of the display panel, so that other persons at the two sides of the display panel cannot see the privacy information displayed on the display panel.

When the light-emergent surface of the light source is not regularly polygonal or orbicular, in order to guarantee that the collimator can collimate all the light emitted from the light source as far as possible, the orthographic projection of the collimator on the plane where the light-emergent surface of the light source is located needs to cover the light-emergent surface. Thus, a part of idle areas usually exist on the surface of the collimator that achieves the effect of collimation and these part of idle areas do not achieve the effect of collimation. Therefore, the overall utilization ratio of the collimator is low.

SUMMARY

The present disclosure provides a light source assembly, a backlight module and a display device. The technical solutions are as follows:

In a first aspect, there is provided a light source assembly. The light source assembly includes a light source and a collimator. The collimator is arranged on a side of the light source where a light-emergent surface is located.

When light emitted from the light source is incident on a preset surface of the collimator, a first included angle is formed between the light and the light-emergent surface. When the light is emitted out of the preset surface, a second included angle is formed between the light and the light-emergent surface. The first included angle is less than the second included angle, and the amount of light incident on per unit area of the preset surface is greater than a preset light amount threshold.

The light-emergent surface of the light source is located in a first plane. The total number of all symmetry axes of the figure of the light-emergent surface is less than 3, and the total number of all symmetry axes of the figure of an orthographic projection region of the collimator on the first plane is less than 3.

In some embodiments, the shape of the light-emergent surface of the light source is an axially-symmetric figure having two symmetry axes comprising a first symmetry axis and a second symmetry axis.

In some embodiments, the maximum length of the collimator in a direction of the first symmetry axis is greater than the maximum length of the collimator in a direction of the second symmetry axis.

The maximum length of the light-emergent surface in the direction of the first symmetry axis is greater than the maximum length of the light-emergent surface in the direction of the second symmetry axis.

The direction of the first symmetry axis is an extending direction of the first symmetry axis, and the direction of the second symmetry axis is an extending direction of the second symmetry axis.

In some embodiments, the ratio of the maximum length of the collimator in the direction of the first symmetry axis to the maximum length of the collimator in the direction of the second symmetry axis is equal to the ratio of the maximum length of the light-emergent surface in the direction of the first symmetry axis to the maximum length of the light-emergent surface in the direction of the second symmetry axis.

In some embodiments, the collimator is polyhedral.

The orthographic projection region of a first end of the collimator that is close to the light source on the plane where the light-emergent surface of the light source is located is within the orthographic projection region of a second end of the collimator that is away from the light source on the plane where the light-emergent surface of the light source is. That is, an end of the collimator that is close to the light source is the first end and an end of the collimator that is away from the light source is the second end. The orthographic projection region of the first end on the first plane is within the orthographic projection region of the second end on the first plane.

The first end is provided with a concave hole. A bottom surface of the concave hole is a curved surface bent toward outside of the collimator, a side surface of the concave hole is a plane, and the light source is arranged in the concave hole.

The second end is provided with a protrusion, a first surface of the protrusion that is away from the light source is a curved surface bent toward outside of the collimator, and both the bottom surface of the concave hole and the first surface belong to the preset surface.

In some embodiments, surfaces of the collimator which connect the first end and the second end comprise: two curved surfaces that are bent toward outside of the collimator and distributed in the direction of the first symmetry axis, two curved surfaces that are bent toward outside of the collimator and distributed in the direction of the second symmetry axis, and two planes are all distributed in the direction of the second symmetry axis. That is, the surfaces of the collimator which connect the first end and the second end comprise: two first curved surfaces, two second curved surfaces and two second planes. The first curved surfaces and the second curved surfaces are all bent toward outside of the collimator. In addition, the two first curved surfaces are distributed in the direction of the first symmetry axis and the two second curved surfaces and the two planes are distributed in the direction of the first symmetry axis.

The two curved surfaces distributed in the direction of the first symmetry axis are connected to the first end and the second end respectively; the two curved surfaces distributed in the direction of the second symmetry axis are both connected to the first end; the two planes are connected to the two curved surfaces distributed in the direction of the second symmetry axis respectively, and are both connected to the second end; and the two curved surfaces distributed in the direction of the first symmetry axis and the two curved surfaces distributed in the direction of the second symmetry axis are all the preset surface. That is, the two first curved surfaces are connected to the first end and the second end respectively; the two second curved surfaces are both connected to the first end; the two second planes are connected to the two second curved surfaces respectively, and are both connected to the second end; and the two first curved surfaces and the two second curved surfaces are all the preset surface.

In some embodiments, a light absorption layer is arranged on each of the two second planes, and an absorption surface of the light absorption layer faces towards an interior of the collimator.

In some embodiments, a light reflecting layer is arranged on each of the two first curved surfaces distributed in the direction of the first symmetry axis and the two second curved surfaces distributed in the direction of the second symmetry axis, and the reflecting surface of the light reflecting layer faces towards an interior of the collimator. That is, a light reflecting layer is arranged on each of the two first curved surfaces and the two second curved surfaces, and the reflecting surface of the light reflecting layer faces towards an interior of the collimator.

In some embodiments, in the collimator, the two second planes distributed in the direction of the second symmetry axis are perpendicular to the light-emergent surface of the light source. That is, the two second planes are perpendicular to the light-emergent surface of the light source.

In some embodiments, the bottom surface and the first surface belong to two curved surfaces of the same convex lens respectively, and the light source is arranged at a focus point of the convex lens.

In some embodiments, the shape of the light-emergent surface of the light source is a rectangle or an ellipse.

In some embodiments, the shape of the light-emergent surface of the light source is a rectangle of 0.8 mm in length and 0.3 mm in width.

The maximum length of the collimator in the direction of the first symmetry axis is 2 mm, the maximum length of the collimator in the direction of the second symmetry axis is 0.8 mm, and the maximum length of the collimator in the direction perpendicular to the light-emergent surface of the light source is 1.5 mm.

In some embodiments, the light source is a light emitting diode, a chip on board light source or a chip on film light source.

In some embodiments, the collimator is made of a transparent material.

In some embodiments, the transparent material is glass, polymethyl methacrylate or polycarbonate.

In some embodiments, both the first curved surface and the second curved surface are paraboloids or free curved surfaces, and the bottom surface and the first surface are cylindrical surfaces, deformable cylindrical surfaces or free curved surfaces.

In a second aspect, there is provided a backlight module. The backlight module includes a light source assembly and a light guide plate. The light source assembly may be the light source assembly described in the first aspect.

In some embodiments, the backlight module includes a plurality of light source assemblies arranged on a light-incident side of the light guide plate in an array.

In some embodiments, the backlight module is a direct-type backlight module or a side-type backlight module.

In a third aspect, there is provided a display device. The display device includes the backlight module described in the second aspect.

In some embodiments, the display device further includes a liquid crystal display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 1-2 is a schematic diagram of light propagation provided in an embodiment of the present disclosure;

FIG. 2 is a structural schematic diagram of a light-emergent surface of a light source provided in an embodiment of the present disclosure;

FIG. 4-1 is a view of a light source assembly provided in an embodiment of the present disclosure;

FIG. 4-2 is another view of a light source assembly provided in an embodiment of the present disclosure;

FIG. 5-1 is yet another view of a light source assembly provided in an embodiment of the present disclosure;

FIG. 5-2 is yet another view of a light source assembly provided in an embodiment of the present disclosure;

DETAILED DESCRIPTION OF THE EMBODIMENTS

In order to make the objectives, technical solutions, and advantages of the present disclosure more clear, the embodiments of the present disclosure are described in further detail below with reference to the accompanying drawings.

Figure 1:
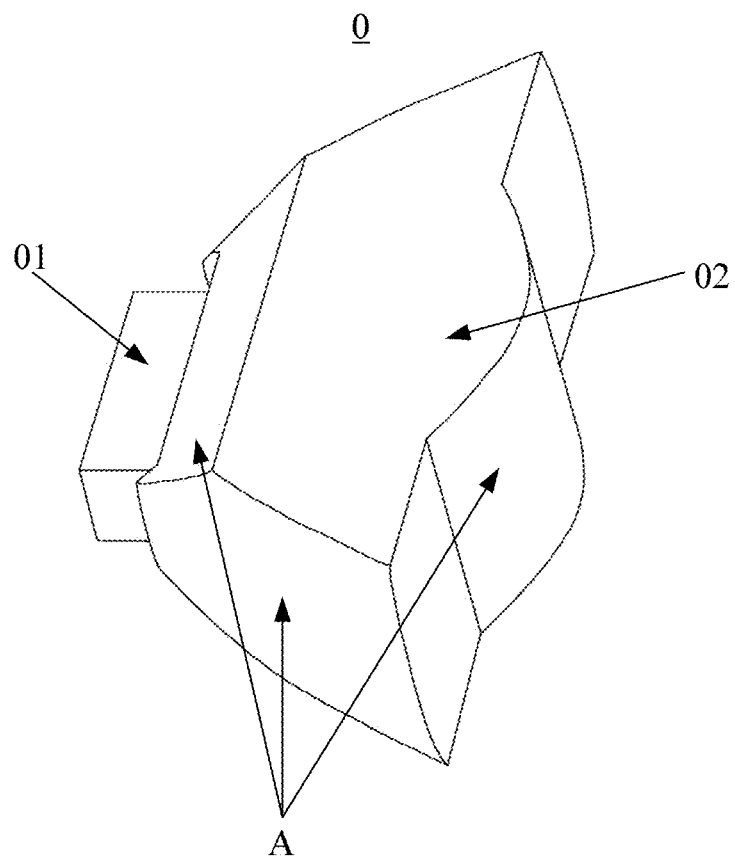
FIG. 1-1 is a structural schematic diagram of a light source assembly provided in an embodiment of the present disclosure.
Figures 1, 2:
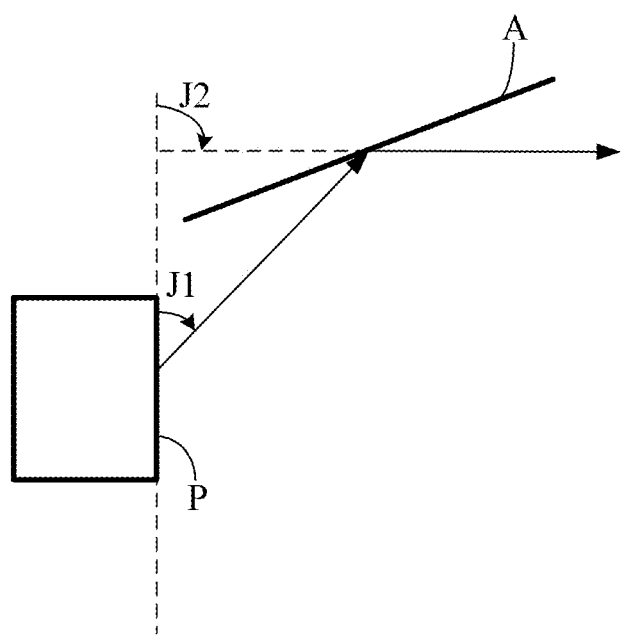
Figure 2:
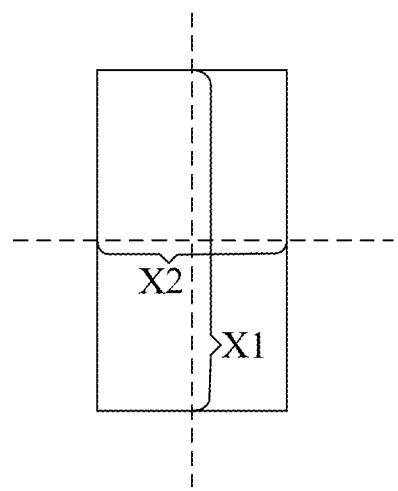

FIG. 1-1 is a structural schematic diagram of a light source assembly 0 provided by the embodiments of the present disclosure. FIG. 1-2 is a diagram of light propagation provided by the embodiments of the present disclosure. In conjunction with FIGS. 1-1 and 1-2, the light source assembly 0 may comprise a light source 01 and a collimator 02 arranged on the side of the light source 01 where the light-emergent surface is located. That is, the light source assembly 0 may comprise a light source 01 and a collimator 02, where the collimator 02 is arranged on the side of the light source 01 where the light-emergent surface P is located.

When light emitted from the light source 01 is incident on preset surfaces A of the collimator 02, the light and the light-emergent surface P form a first included angle J1. When the light exits from the preset surfaces A, the light and the light-emergent surface P form a second included angle J2. The first included angle J1 is less than the second included angle J2, and the amount of light incident on per unit area of the preset surfaces A is greater than a preset light amount threshold.

The light-emergent surface P of the light source 01 is located on a first plane, the total number of all symmetry axes of the figure of the light-emergent surface P of the light source 01 is less than 3, and the total number of all symmetry axes of the figure of the orthographic projection region of the collimator 02 on the first plane is less than 3. For example, when the figure of the light-emergent surface P of the light source 01 is a rectangle or an ellipse, the figure of the orthographic projection region of the collimator 02 on the first plane may also be a rectangle or an ellipse. The figure of the light-emergent surface P may be the same as the figure of the orthographic projection region of the collimator 02 on the first plane in shape.

In summary, the light source assembly provided by the embodiments of the present disclosure comprises a light source and a collimator. No matter how the shape of the light-emergent surface of the light source changes, it is necessary to ensure that the amount of the light incident on per unit area of the preset surface that achieves the effect of collimating light in the collimator is greater than a preset light amount threshold such that all regions in the collimator can achieve the effect of collimating light. Thus, the overall utilization ratio of the collimator is improved.

It should be noted that only one light-emergent surface A in the light source assembly is shown in FIG. 1-2, and the light-emergent surface A shown in FIG. 1-2 is a plane. The light-emergent surface A in FIG. 1-1 may be a plane or a curved surface.

In the related art, when the maximum lengths of the light-emergent surface in certain two directions are different (for example, the light-emergent surface is not regularly polygonal or orbicular), the amount of light incident on per unit area of certain surfaces among the surfaces that achieve the effect of collimation in the collimator is less than or equal to the preset light amount threshold, and the amount of light incident on per unit area of other surfaces that achieve the effect of collimation is great than the preset light amount threshold. That is, among the surfaces achieving the effect of collimation, the amount of the light incident onto per unit area of some surfaces is greater, but the amount of the light incident onto per unit area of other surfaces is less, so that a part of idle region exist on the surfaces that achieve the effect of collimation in the collimator and do not achieve the effect of collimation. However, in the embodiments of the present disclosure, when the maximum lengths of the light-emergent surface in certain two directions are different (for example, the light-emergent surface is not regularly polygonal or orbicular), the surface that achieves the effect of collimation in the collimator is the preset surface, and the amount of light incident on per unit area of the preset surface is greater than the light amount threshold, that is, the amount of light incident on per unit area of the preset surface is great, so that no idle region exists in the collimator provided in the embodiments of the present disclosure. That is, the uniformity of the amount of incident light on the surface that achieves the effect of collimation in the collimator provided in the embodiments of the present disclosure is greater than the uniformity of the amount of incident light on the surface that achieves the effect of collimation in the collimator provided in the related art.

It should be noted that both the first included angle J1 and the second included angle J2 mentioned in the embodiments of the present disclosure may be greater than or equal to 0 degree, and less than or equal to 90 degrees. That is, 90 degrees≤J1≥0 degrees and 90 degrees≥J2≥0 degrees. The preset surfaces A may be planes or curved surfaces, which is not limited in the embodiments of the present disclosure.

In some embodiments, the first direction and the second direction are two different directions. The maximum length of the light-emergent surface in the first direction may be greater than the maximum length of the light-emergent surface in the second direction. Here, the maximum length of the collimator in the first direction may be greater than the maximum length of the collimator in the second direction. That is, when the maximum lengths of the light-emergent surface in certain two directions are different, the maximum lengths of the collimator in the two certain directions are also different.

Further, the light-emergent surface of the light source 01 may be an axially-symmetric figure having two symmetry axes (only having two symmetry axes). That is, the light-emergent surface of the light source 01 may be an axially-symmetric figure having two symmetry axes. For example, the two symmetry axes may comprise a first symmetry axis and a second symmetry axis. The direction of the first symmetry axis (i.e., an extending direction of the first symmetry axis) may be the first direction, and the direction of the second symmetry axis (i.e., an extending direction of the second symmetry axis) may be the second direction. The maximum length of the collimator in the direction of the first symmetry axis is greater than the maximum length of the collimator in the direction of the second symmetry axis. The maximum length of the light-emergent surface in the direction of the first symmetry axis is greater than the maximum length of the light-emergent surface in the direction of the second symmetry axis. It should be noted that the first symmetry axis may be perpendicular to the second symmetry axis. In the embodiments of the present disclosure, the first direction as the direction of the first symmetry axis and the second direction as the direction of the second symmetry axis are taken as an example. In practice, the first direction may also be not the direction of the first symmetry axis and the second direction may also be not the direction of the second symmetry, which is not limited in the embodiments of the present disclosure.

Figure 3:
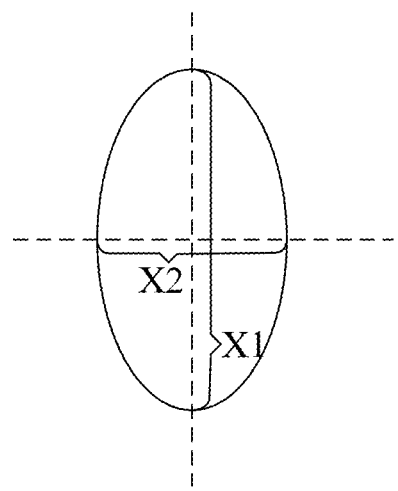
FIG. 3 is a structural schematic diagram of a light-emergent surface of another light source provided in an embodiment of the present disclosure.

For example, FIG. 2 is a structural schematic diagram of a light-emergent surface of a light source 01 provided in the embodiments of the present disclosure. FIG. 3 is a structural schematic diagram of a light-emergent surface of another light source 01 provided in the embodiments of the present disclosure. As shown in FIG. 2, the light-emergent surface of the light source 01 may be a rectangle. As shown in FIG. 3, the light-emergent surface of the light source 01 maybe an ellipse. Both the rectangle and the ellipse have two symmetry axes. In FIG. 2, the length X1 of the line segment between two intersection points of the first symmetry axis and edges of the rectangle is the maximum length of the light-emergent surface in the direction of the first symmetry axis, and the length X2 of the line segment between two intersection points of the second symmetry axis and edges of the rectangle is the maximum length of the light-emergent surface in the direction of the second symmetry axis. In FIG. 3, the length X1 of the line segment between two intersection points of the first symmetry axis and an edge of the ellipse is the maximum length of the light-emergent surface in the direction of the first symmetry axis, and the length X2 of the line segment between two intersection points of the second symmetry axis and the edge of the ellipse is the maximum length of the light-emergent surface in the direction of the second symmetry axis. It can be known that X1 is greater than X2.

Figures 1, 4:
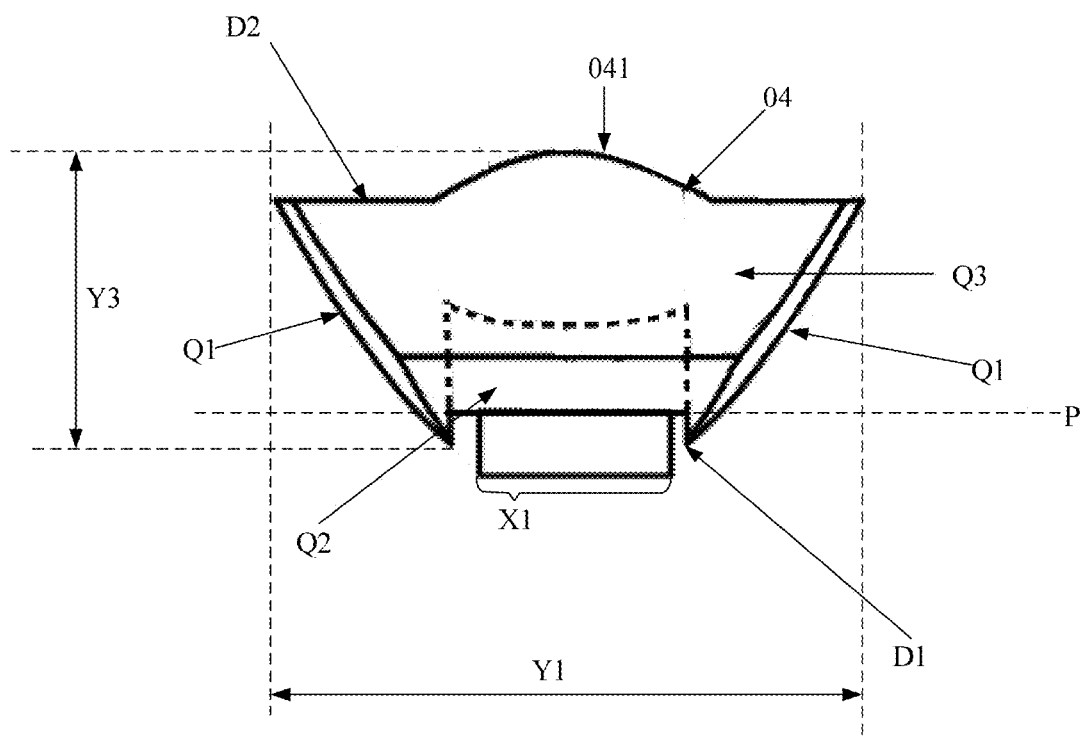
Figures 2, 4:
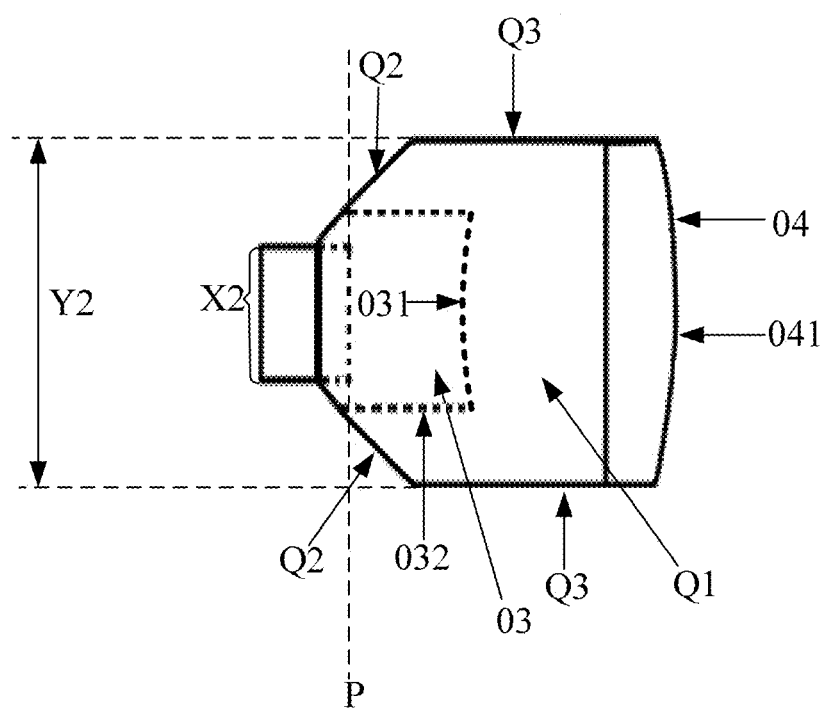

FIG. 4-1 is a view of a light source assembly 0 provided in the embodiments of the present disclosure. FIG. 4-2 is another view of a light source assembly 0 provided in the embodiments of the present disclosure. When an observer directly faces FIG. 4-1 assuming that the observer is located directly in front of the light source assembly 0 and an identifier Y3 in FIG. 4-1 is located on the left of the light source assembly 0, the view in FIG. 4-1 is a front view of the light source assembly 0, and the view in FIG. 4-2 is the left view of the light source assembly 0.

In conjunction with FIG. 4-1 and FIG. 4-2, it can be seen that the maximum length Y1 of the collimator 02 in the direction of the first symmetry axis is greater than the maximum length Y2 of the collimator 02 in the direction of the second symmetry axis. That is, the maximum length Y1 of the collimator in the direction of the first symmetry axis is great when the maximum length (i.e., X1 in FIG. 2 or FIG. 3) of the light-emergent surface of the light source along the first symmetry axis is great, and the maximum length Y2 of the collimator in the direction of the second symmetry axis is small when the maximum length (i.e., X2 in FIG. 2 or FIG. 3) of the light-emergent surface of the light source along the second symmetry axis is small, such that the collimator 02 is adapted to the light-emergent surface of the light source 01 in shape. Thus, it can be further ensured that the luminous flux of any two unit areas is equal among the surfaces of the collimator 02 that face the light source 01.

That is, the maximum length of the collimator in the direction of the first symmetry axis is greater than the maximum length of the collimator in the direction of the second symmetry axis. The maximum length of the light-emergent surface in the direction of the first symmetry axis is greater than the maximum length of the light-emergent surface in the direction of the second symmetry axis. In some embodiments, the ratio of the maximum length of the collimator in the direction of the first symmetry axis to the maximum length of the collimator in the direction of the second symmetry axis may be equal to the ratio of the maximum length of the light-emergent surface in the direction of the first symmetry axis to the maximum length of the light-emergent surface in the direction of the second symmetry axis. That is, the ratio of the maximum lengths of the collimator in the direction of the first symmetry axis and in the direction of the second symmetry axis may be equal to the ratio of the maximum lengths of the light-emergent surface in the direction of the first symmetry axis and in the direction of the second symmetry axis.

In some embodiments, when the light-emergent surface of the light source 01 is a rectangle, the rectangle may be 0.8 mm in length and 0.3 mm in width. The maximum length Y1 of the collimator 02 in the direction of the first symmetry axis may be 2 mm, the maximum length Y2 of the collimator 02 in the direction of the second symmetry axis may be 0.8 mm, and the maximum length Y3 of the collimator 02 in the direction perpendicular to the light-emergent surface of the light source 01 may be 1.5 mm. The light-emergent surface of the light source 01 is located on a first plane, and may be located in the orthographic projection region of the collimator 02 on the first plane. That is, the orthographic projection region of the collimator 02 on the first plane may cover the light-emergent surface of the light source.

It should be noted that the collimator 01 in the light source assembly 01 provided in the embodiments of the present disclosure may be polyhedral. The specific shape of the collimator 01 will be explained in detail below in conjunction with FIGS. 4-1 and 4-2.

The orthographic projection region of a first end D1 of the collimator 02 that is close to the light source 01 on the first plane P where the light-emergent surface of the light source 01 is located is within the orthographic projection region of a second end D2 of the collimator 02 that is away from the light source 01 on the first plane P where the light-emergent surface of the light source 01 is located. That is, the end of the collimator 02 that is close to the light source 01 is the first end D1 and the end of the collimator 02 that is away from the light source 01 is the second end D2. The first end D1 of the collimator 02 is small, but the second end D2 of the collimator 02 is large.

For example, the first end D1 of the collimator 02 may be provided with a concave hole 03. The bottom surface 031 of the concave hole 03 is a curved surface that bends outwards the collimator 02 (and bend towards the direction close to the light source 01). The side surface 032 of the concave hole 03 is a plane, and the light source 01 is arranged in the concave hole 03. It should be noted that a certain surface bent toward outside of the collimator mentioned in the embodiments of the present disclosure means that the central region of the surface bends toward outside of the collimator. For example, when the bottom surface 031 of the concave hole 03 bends toward outside of the collimator 02, the central region of the bottom surface 031 is close to the light source 01, the edge region of the bottom surface 031 is far from the light source 01, and the edge region of the bottom surface 031 surrounds the central region of the bottom surface 031.

The second end D2 of the collimator 02 may be provided with a protrusion 04, and a first surface 041 of the protrusion 04 that is away from the light source 04 is a curved surface bent toward outside of the collimator 02 (and bend towards the direction away from the light source 01). Both the bottom surface 031 of the concave hole 03 and the first surface 041 of the protrusion 04 that is away from the light source 01 are preset surfaces in the collimator 02.

Further, both the bottom surface 031 of the concave hole 03 and the first surface 041 of the protrusion 04 are curved surfaces that bend in two opposite directions toward outside of the collimator 02. The bottom surface 031 and the first surface 041 may be two curved surfaces belonging to the same convex lens respectively. The light source 01 may be located at the focal point of the convex lens in the concave hole 03, so that the bottom surface 031 of the concave hole 03 can effectively collimate the light emitted from the light source 01. In some embodiments, the bottom surface 031 of the concave hole 03 and the first surface 041 of the protrusion 04 may be two curved surfaces facing each other of a certain convex lens. In addition, the bottom surface 031 of the concave hole 03 and the first surface 041 of the protrusion 04 can function as a convex lens. After entering the collimator 02 from the bottom surface 031 of the concave hole 03, the light emitted from the light source 01 may exit out of the collimator 02 from the first surface 041 of the protrusion 04. Both the bottom surface 031 of the concave hole 03 and the first surface 041 of the protrusion 04 may collimate the light.

The surfaces on the collimator 02 that connect the first end D1 and the second end D2 may comprise: two first curved surfaces Q1 distributed in the direction of the first symmetry axis and bent toward outside of the collimator 02, two second curved surfaces Q2 distributed in the direction of the second symmetry axis and bent toward outside of the collimator 02, and two second planes Q3 distributed in the direction of the second symmetry axis. That is, the surfaces on the collimator 02 that connect the first end D1 and the second end D2 may comprise: two first curved surfaces Q1, two second curved surfaces Q2, and two second planes Q3, where the first curved surfaces Q1 and the second curved surfaces Q2 bend toward outside of the collimator 02, the two first curved surfaces Q1 are distributed in the direction of the first symmetry axis, and the two second curved surfaces Q2 and the two second planes Q3 are all distributed in the direction of the second symmetry axis.

The two first curved surfaces Q1 distributed in the direction of the first symmetry axis are connected to the first end D1 and the second end D2 respectively. The two second curved surfaces Q2 distributed in the direction of the second symmetry axis are connected to the first end Dl. The two second planes Q3 are connected to the two second curved surfaces Q2 distributed in the direction of the second symmetry axis, respectively, and are connected to the second end D2. The two first curved surfaces Q1 distributed in the direction of the first symmetry axis and the two second curved surfaces Q2 distributed in the direction of the second symmetry axis all belong to the preset surfaces in the collimator 02. In some embodiments, the two second planes Q3 distributed in the direction of the second symmetry axis may be perpendicular to the light-emergent surface of the light source 01. That is, the two first curved surfaces Q1 are connected to the first end D1 and the second end D2 respectively; the two second curved surfaces Q2 are connected to the first end D1; the two second planes Q3 are connected to the two second curved surfaces Q2 respectively, and are connected to the second end D2; and the two first curved surfaces Q1 and the two second curved surfaces Q2 are all the preset surfaces.

That is, the first end D1 and the second end D2 of the collimator 02 are connected through the two first curved surfaces Q1; and the first end D1 and the second end D2 of the collimator 02 are connected further through the two second curved surfaces Q2 and the two second planes Q3. In addition, since the two first curved surfaces Q1 distributed in the direction of the first symmetry axis and the two second curved surfaces Q2 distributed in the direction of the second symmetry axis are all bent toward outside of the collimator 02, both the first curved surfaces Q1 and the second curved surfaces Q2 can collimate the light emitted from the light source 01, thereby reducing the light with a relatively large exiting angle among the light emitted from the light source assembly.

Further, a light absorption layer may arranged on each of the two second planes Q3 distributed in the direction of the second symmetry axis, and the absorption surface of the light absorption layer may face towards the interior of the collimator 02. When the light emitted from the light source 01 is incident on the collimator 02 and incident on the two second planes Q3 distributed in the direction of the second symmetry axis, a light absorption layer is arranged on each of the two second planes Q3 in the embodiments of the present disclosure to prevent the light from reflecting under the action of the second planes Q3. The light absorption layer can absorb light incident on the two second planes Q3, thereby preventing the light with a relatively large incident angle from reflecting on the two second planes Q3, and reducing the light with the relatively large exiting angle among the light exiting from the second end D2 of the collimator.

In order to improve the utilization ratio of the light emitted from the light source 01 by the collimator 02, a light reflecting layer may be arranged on each of the two first curved surfaces Q1 distributed in the direction of the first symmetry axis and the two second curved surfaces Q2 distributed in the direction of the second symmetry axis, and the reflecting surface of the light reflecting layer faces towards the interior of the collimator 02. When the light emitted from the light source 01 is incident on the first curved surfaces Q1 or the second curved surfaces Q2, the first curved surfaces Q1 and the second curved surfaces Q2 can reflect the incident light, so that the light is prevented from exiting out of the collimator 02 directly from the first curved surfaces Q1 or the second curved surfaces Q2, thereby preventing a waste of the light emitted from the light source 01 and thus improving the utilization ratio of the light emitted from the light source 01.

In some embodiments, the light source 01 in the light source assembly 0 provided in the embodiments of the present disclosure may be a light emitting diode (LED), a chip on board (COB) light source or a chip on film (COF) light source. The light source 01 can also be other type of light sources which is not limited in the embodiments of the present disclosure.

It should be noted that the above-mentioned surfaces facing the light source 01 may comprise: the bottom surface 031 of the concave hole 03, the side surface 032 of the concave hole 03, the two first curved surfaces Q1 distributed in the direction of the first symmetry axis and the two second curved surfaces Q2 distributed in the direction of the second symmetry axis. That is, in the embodiments of the present disclosure, the light emitted from the light source 01 may be uniformly incident on the bottom surface 031, the side surface 032, the two first curved surfaces Q1 and the two second curved surfaces Q2.

For example, the collimator may be made of glass, polymethyl methacrylate (PMMA), polycarbonate (PC) or other transparent materials. The first curved surfaces Q1 and the second curved surfaces Q2 may be paraboloids or free curved surfaces. The bottom surface 031 and the first surface 041 may be cylindrical surfaces, deformable cylindrical surfaces or free curved surfaces.

Figures 1, 5:
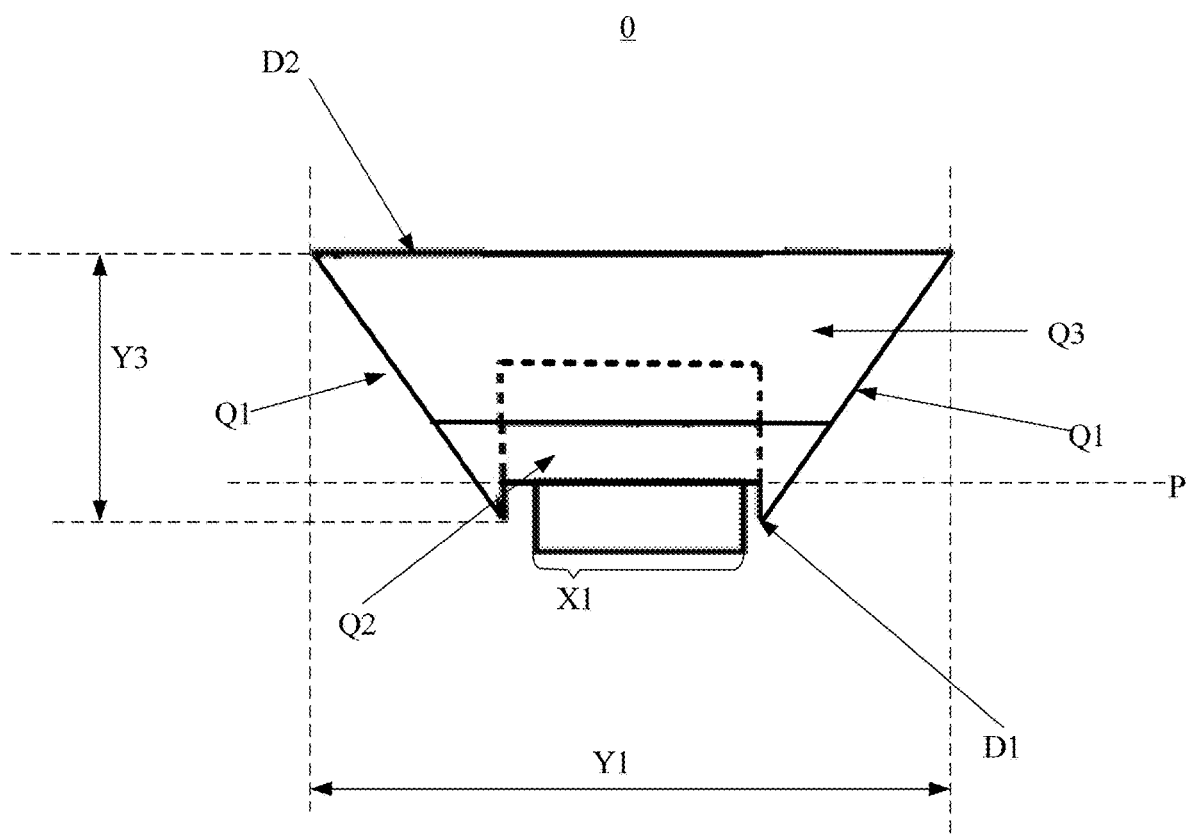
Figures 2, 5:
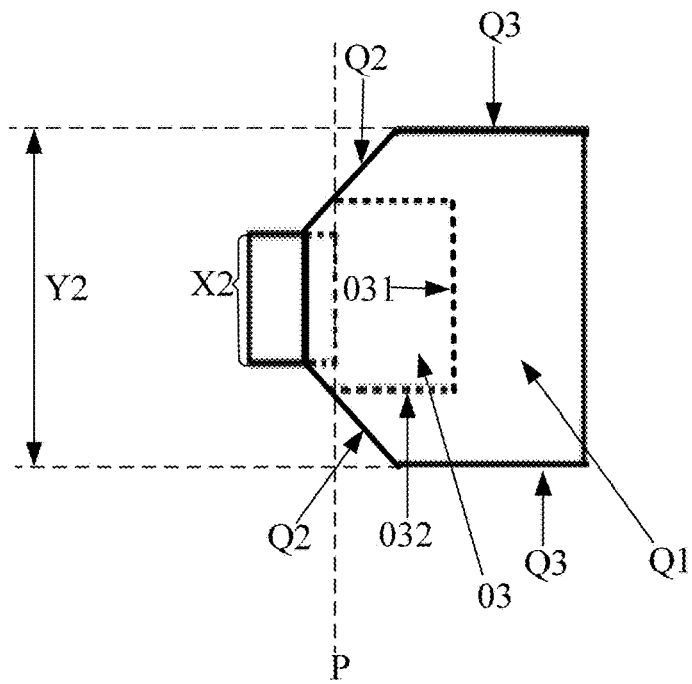

In some embodiments, the first curved surfaces Q1, the second curved surfaces Q2, the bottom surface 031 and the first surface 041 in the embodiments of the present disclosure are curved surfaces. In practice, the second end D2 of the collimator 02 may not be provided with the protrusion 04, and the first curved surfaces Q1, the second curved surfaces Q2 and the bottom surface 031 may be replaced with planes (as shown in FIGS. 5-1 and 5-2), which is not limited in the embodiments of the present disclosure. FIG. 5-1 is yet another view of a light source assembly provided in the embodiments of the present disclosure. FIG. 5-2 is still yet another view of a light source assembly provided in the embodiments of the present disclosure. When an observer directly faces FIG. 5-1, assuming that the observer is located directly in front of the light source assembly 0 and an identifier Y3 in FIG. 5-1 is on the left of the light source assembly 0, then the view in FIG. 5-1 is the front view of the light source assembly 0, and the view in FIG. 5-2 is the left view of the light source assembly 0.

Figure 6:
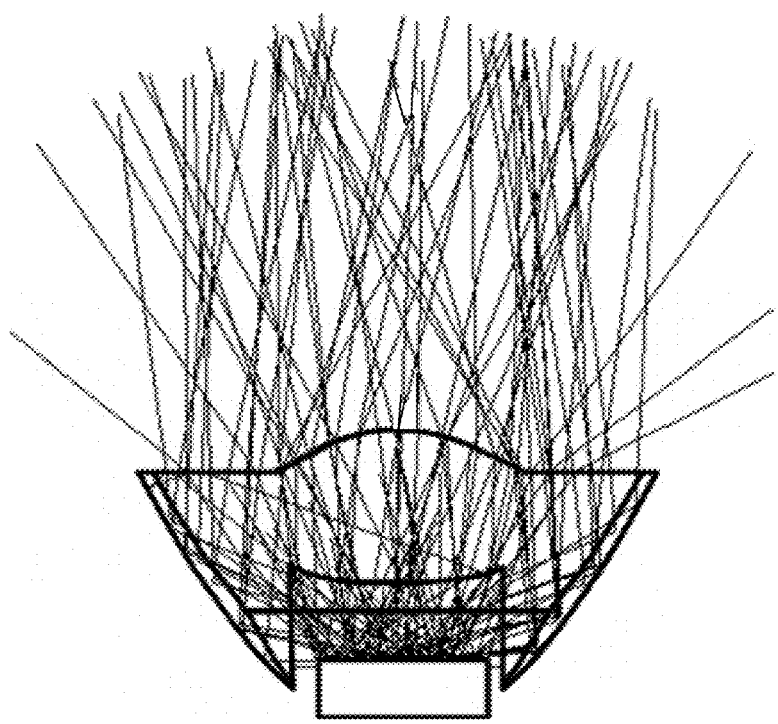
FIG. 6 is a schematic diagram of a light tracing result of a light source assembly provided in an embodiment of the present disclosure.
Figure 7:
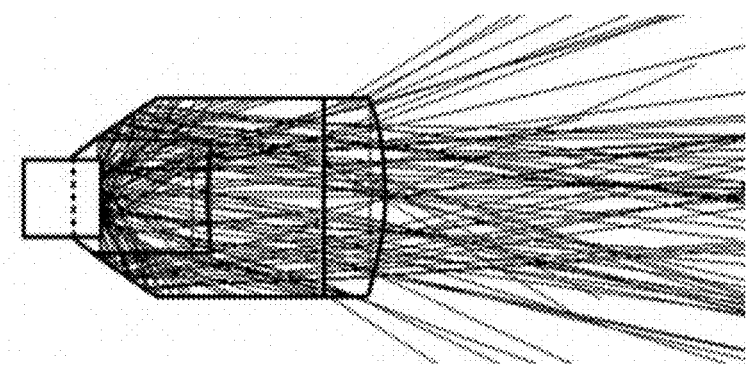
FIG. 7 is a schematic diagram of another light tracing result of a light source assembly provided in an embodiment of the present disclosure.
Figure 8:
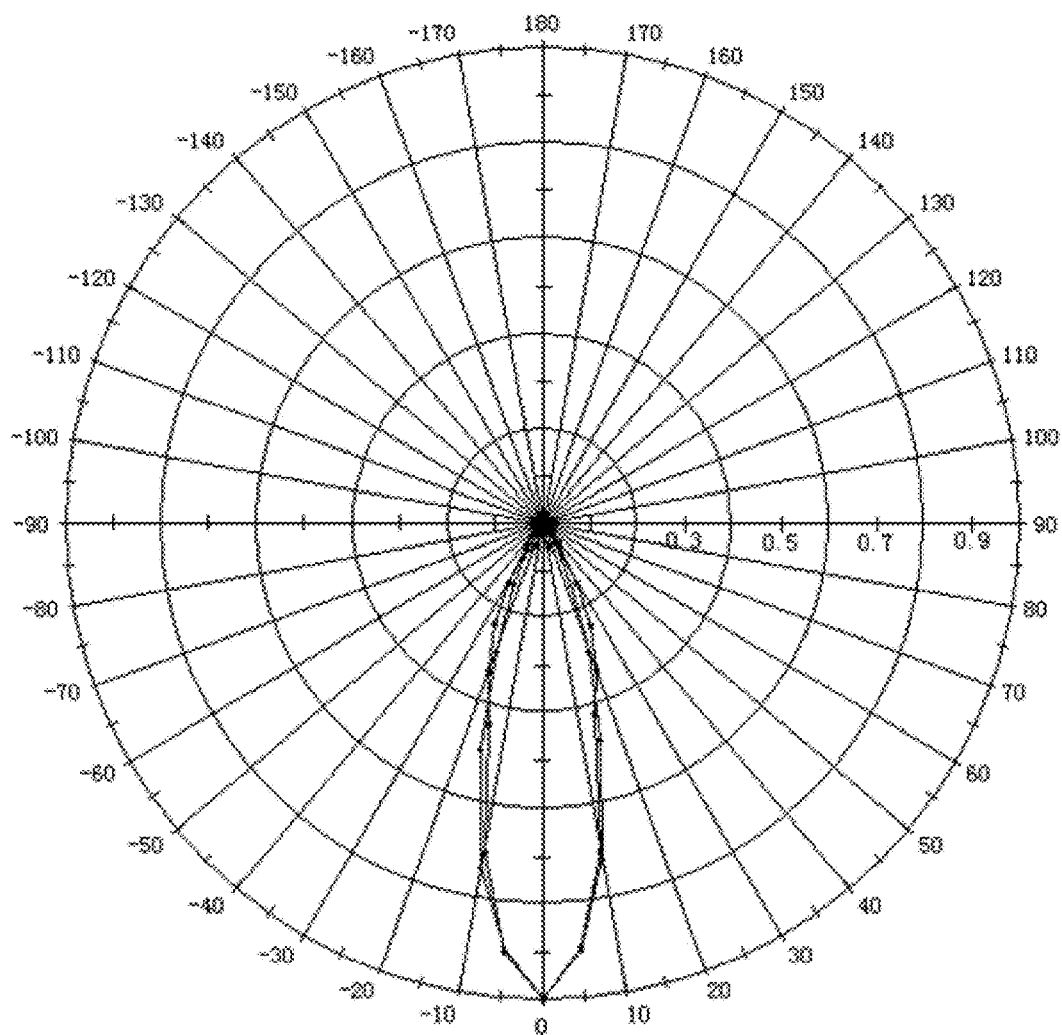
FIG. 8 is a schematic diagram of light intensity distribution of light emitted by a light source assembly provided in an embodiment of the present disclosure.
Figure 9:
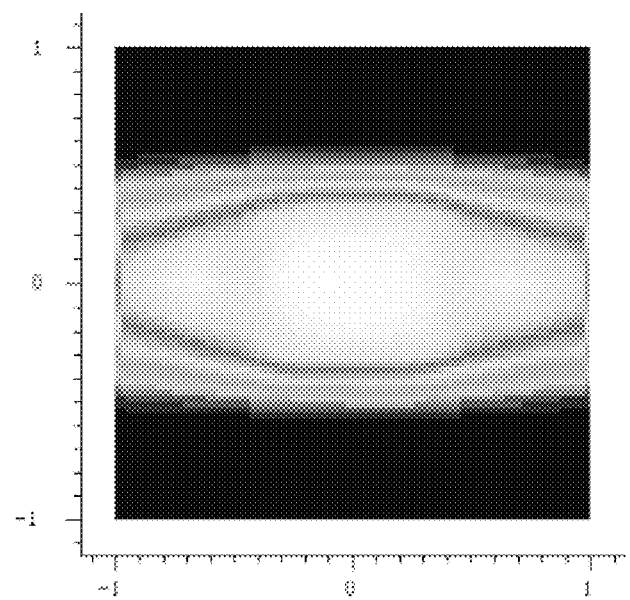
FIG. 9 is a schematic diagram of illumination distribution of an emergent surface of a light source assembly provided in an embodiment of the present disclosure.

After light tracing is performed on the light source assembly provided in the embodiments of the present disclosure, schematic diagrams of light tracing results as shown in FIGS. 6 and 7 may be obtained. FIG. 6 corresponds to FIG. 4-1, and FIG. 7 corresponds to FIG. 4-2. FIG. 8 is a schematic diagram of light intensity distribution of the light emitted from a light source assembly provided in the embodiments of the disclosure. In addition, FIG. 9 is a schematic diagram of illumination distribution of an emergent surface of a light source assembly provided in the embodiments of the disclosure. It should be noted that the light-emergent surface of the light source assembly here is a surface at the second end of the collimator.

In FIG. 9, the abscissas is a coordinate of each point of the collimator of the light source assembly in the direction of the first symmetry axis in millimetres, and the ordinate is a coordinate of each point of the collimator of the light source assembly in the direction of the second symmetry axis also in millimetres.

In conjunction with FIGS. 4-1, 4-2, 6 and 7, among the light emitted from the light source, a part of the light is incident on the bottom surface 031 of the concave hole 03 and is collimated under the action of the bottom surface 031 and the first surface 041 of the protrusion 04 and the other part of the light is incident on the side surface of the concave hole 03, is collimated and reflects on the first curved surfaces Q1 and the second surfaces Q2, and finally exits from the second end D2 of the collimator 02. In addition, among the light incident on the collimator 02 through the concave hole 03, a small part of the light is also incident on the second planes Q3 and is absorbed by the light absorption layers arranged on the second planes Q3.

Most of the light emitted from the light source 01 is constrained within a relatively small divergence angle. FIG. 8 shows distribution situation of the intensity and angles of the light emitting from the light source assembly. FIG. 8 contains a plurality of concentric circles and a plurality of line segments passing through the diameters of the circles. Numbers at intersections of meridians (i.e., the line segments passing through the diameters of the circles) and the outermost circle denote angles which range from −180 degrees to 180 degrees. Parallels (i.e., the plurality of concentric circles) denote normalized light intensity which ranges from 0 to 1. It can be seen from FIG. 8 that the half-wave full-width angle of emergent light is in a range from −15 degrees to 15 degrees. Therefore, the divergence angle of the light emitted from the light source assembly provided in the embodiments of the present disclosure is relatively small, and the effect of collimation is better. Further, it can be seen from FIG. 9 that the illumination of the emergent surface of the light source assembly in the embodiments of the present disclosure is relatively uniform. That is, the light source assembly provided in the embodiments of the present disclosure may emit light which has a relatively small divergence angle and is distributed relatively uniformly.

In addition, the volume of the light source assembly provided in the embodiments of the present disclosure is also relatively small. When the light source assembly is used for a side-type display device, the volume of the light source assembly is relatively small as the maximal length of the light source assembly in the direction of the second symmetry axis is relatively small. Therefore, a plurality of light source assemblies may be arranged in sequence in the direction of the first symmetry axis to obtain a relatively flat light bar, and the light bar may be arranged in a thinned display device as a small-size light source. When the light source assembly is used for a direct-type display device, more light source assemblies may be arranged in a limited display area as the volume of the light source assembly is relatively small. Therefore, more light source assemblies can be arranged in an array at the light incident side of the light guide plate.

Further, no matter the display device is a side-type display device or a direct-type display device, the space for arrangement of the light source in the display device is fixed. The light source assembly provided in the embodiments of the present disclosure is relatively small, and therefore more light source assemblies may be arranged in the space of the fixed size, thereby increasing the light emitted from the light source of the display device, improving the display brightness of the display device and improving the light emitting efficiency of the display device.

In the related art, there is also a light source assembly with a relatively large volume. In the light source assembly with the relatively large volume, the volume of the collimator is far larger than the volume of the light source. When the light source assembly with the relatively large volume is arranged in the side-type display device, the frame of the side-type display device is relatively wide. When the light source assembly with the relatively large volume is arranged in the direct-type display device, the direct-type display device is relatively thick. However, in the light source assembly provided in the embodiments of the present disclosure, the volume of the collimator is not far larger than the volume of the light source, so that the volume of the light source assembly provided in the embodiments of the present disclosure is relatively small. Therefore, the frame of the side-type display device adopting the light source assembly provided in the embodiments of the present disclosure is relatively narrow, and the direct-type display device adopting the light source assembly provided in the embodiments of the present disclosure is relatively thick.

It should be noted that the light source assembly provided in the embodiments of the present disclosure can emit relatively collimated light. When a user is located directly in front of the display device, the user can see images displayed on the display device. When the user is located in lateral front of the display device, the user cannot see the images displayed on the display device, thereby preventing the other users in lateral front of the display device from seeing the images displayed on the display device. Therefore, the display device comprising the light source assembly has the functions of peep prevention and directional light emitting. In order to improve the utilization ratio of the light emitted from the light source by the collimator, the structures other than the light absorption layer and the light reflecting layer in the collimator may be arranged to be transparent.

In summary, the light source assembly provided in the embodiments of the present disclosure comprises a light source and a collimator. No matter how the shape of the light-emergent surface of the light source changes, it is necessary to ensure that the amount of the light incident on per unit area of the preset surface that achieves the effect of collimating light in the collimator is greater than a preset light amount threshold such that all regions in the collimator can achieve the effect of collimating light. Thus, the overall utilization ratio of the collimator is improved.

Figure 10:
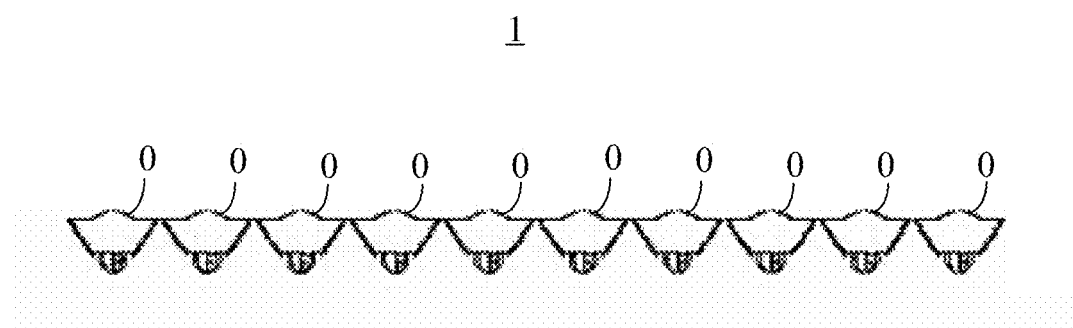
FIG. 10 is a structural schematic diagram of a backlight module provided in an embodiment of the present disclosure.

As shown in FIG. 10, the embodiments of the present disclosure provide a backlight module 1. The backlight module 1 may comprise: a light source assembly 0 and a light guide plate (not shown in FIG. 10). The light source assembly 0 may the one shown in FIG. 4-1, 4-2, 5-1 or 5-2. The backlight module 1 may be a direct-type backlight module and may also be a side-type backlight module. For example, the backlight module 1 may comprise a plurality of light source assemblies 0.

In some embodiments, continuing referring to FIG. 10, the backlight module 1 may comprise a plurality of light source assemblies 0 and the plurality of light source assemblies 0 may be arranged in an array at the light incident side of the light guide plate.

In summary, in the backlight module provided in the embodiments of the present disclosure, the light source assembly comprises a light source and a collimator. No matter how the shape of the light-emergent surface of the light source changes, it is necessary to ensure that the amount of the light incident on per unit area of the preset surface that achieves the effect of collimating light in the collimator is greater than a preset light amount threshold such that all regions in the collimator can achieve the effect of collimating light. Thus, the overall utilization ratio of the collimator is improved.

Figure 11:
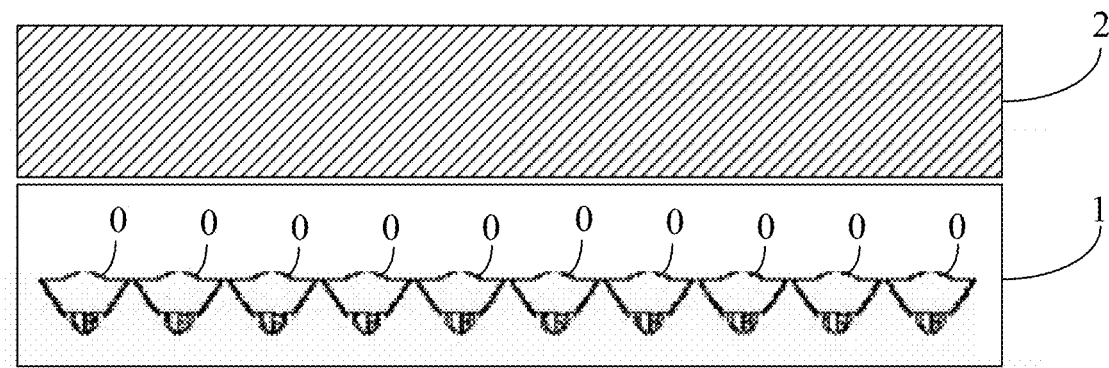
FIG. 11 is a structural schematic diagram of a display device provided in an embodiment of the present disclosure.

The embodiments of the present disclosure provide a display device which may comprise the backlight module 1 as shown in FIG. 10. Further, the display device may further comprise a liquid crystal display panel. As shown in FIG. 11, the backlight module 1 may arranged at the light incident side of the liquid crystal display panel 2, and can emit collimated light to the liquid crystal display panel 2.

In summary, in the display device provided in the embodiments of the present disclosure, the light source assembly comprises a light source and a collimator. No matter how the shape of the light-emergent surface of the light source changes, it is necessary to ensure that the amount of the light incident on per unit area of the preset surface that achieves the effect of collimating light in the collimator is greater than a preset light amount threshold such that all regions in the collimator can achieve the effect of collimating light. Thus, the overall utilization ratio of the collimator is improved.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A light source assembly, comprising a light source and a collimator which is polyhedral, wherein the collimator is arranged on a side of the light source where a light-emergent surface is located;

when light emitted from the light source is incident on any preset surface of the collimator, a first included angle is formed between the light and the light-emergent surface; when the light leaves the preset surface, a second included angle is formed between the light leaving the preset surface and the light-emergent surface; the first included angle is less than the second included angle; and the light-emergent surface of the light source is located in a first plane, a total number of all symmetry axes of a figure of the light-emergent surface is less than 3, and a total number of all symmetry axes of a figure of an orthographic projection region of the collimator on the first plane is less than 3;

wherein the light-emergent surface of the light source has an axially-symmetric shape with a first symmetry axis and a second symmetry axis, an extending direction of the first symmetry axis being different from an extending direction of the second symmetry axis;

wherein an end, close to the light source, of the collimator is a first end; and another end, away from the light source, of the collimator is a second end;

wherein surfaces of the collimator which connect the first end and the second end comprise: two first curved surfaces, two second curved surfaces and two second planes, the first curved surfaces and the second curved surfaces are bent toward outside of the collimator, the two first curved surfaces are distributed in the extending direction of the first symmetry axis, and the two second curved surfaces and the two second planes are all distributed in the extending direction of the second symmetry axis; and wherein the two first curved surfaces are connected to the first end and the second end respectively; the two second curved surfaces are both connected to the first end, the two second planes are connected to the two second curved surfaces respectively, and are both connected to the second end, and the two first curved surfaces and the two second curved surfaces are all preset surfaces.

2. The light source assembly according to claim 1, wherein
a maximum length of the collimator in the extending direction of the first symmetry axis is greater than a maximum length of the collimator in the extending direction of the second symmetry axis; a maximum length of the light-emergent surface in the extending direction of the first symmetry axis is greater than a maximum length of the light-emergent surface in the extending direction of the second symmetry axis.

3. The light source assembly according to claim 2, wherein a ratio of the maximum length of the collimator in the extending direction of the first symmetry axis to the maximum length of the collimator in the extending direction of the second symmetry axis is equal to a ratio of the maximum length of the light-emergent surface in the extending direction of the first symmetry axis to the maximum length of the light-emergent surface in the extending direction of the second symmetry axis.

4. The light source assembly according to claim 1, wherein an orthographic projection region of the first end on the first plane is located in an orthographic projection region of the second end on the first plane;
the first end is provided with a concave hole, and a bottom surface of the concave hole is a curved surface bent toward outside of the collimator, a side surface of the concave hole is a plane, and the light source is arranged in the concave hole;
the second end is provided with a protrusion, a first surface, away from the light source, of the protrusion is a curved surface bent toward outside of the collimator, and both the bottom surface of the concave hole and the first surface belong to the preset surface.

5. The light source assembly according to claim 1, a light absorption layer is arranged on each of the two second planes, and an absorption surface of the light absorption layer faces towards an interior of the collimator.

6. The light source assembly according to claim 1, wherein a light reflecting layer is arranged on each of the two first curved surfaces and the two second curved surfaces, and a reflecting surface of the light reflecting layer faces towards an interior of the collimator.

7. The light source assembly according to claim 1, wherein the two second planes are perpendicular to the light-emergent surface of the light source.

8. The light source assembly according to claim 1, wherein the bottom surface and the first surface belong to two curved surfaces of the same convex lens respectively, and the light source is arranged at a focus point of the convex lens.

9. The light source assembly according to claim 1, wherein a shape of the light-emergent surface of the light source is a rectangle or an ellipse.

10. The light source assembly according to claim 2, wherein a shape of the light-emergent surface of the light source is a rectangle of 0.8 mm in length and 0.3 mm in width;
the maximum length of the collimator in the extending direction of the first symmetry axis is 2 mm, the maximum length of the collimator in the extending direction of the second symmetry axis is 0.8 mm, and the maximum length of the collimator in the direction perpendicular to the light-emergent surface of the light source is 1.5 mm.

11. The light source assembly according to claim 1, wherein the light source is a light emitting diode, a chip on board light source or a chip on film light source.

12. The light source assembly according to claim 1, wherein the collimator is made of a transparent material.

13. The light source assembly according to claim 12, wherein the transparent material is glass, polymethyl methacrylate or polycarbonate.

14. The light source assembly according to claim 1, wherein both the first curved surface and the second curved surface are paraboloids or free curved surfaces, and the bottom surface and the first surface are cylindrical surfaces, deformable cylindrical surfaces or free curved surfaces.

15. A backlight module, comprising a light source assembly and a light guide plate, wherein the light source assembly comprises a light source and a collimator which is polyhedral, wherein the collimator is arranged on a side of the light source where a light-emergent surface is located;
when light emitted from the light source is incident on any preset surface of the collimator, a first included angle is formed between the light and the light-emergent surface; when the light leaves the preset surface, a second included angle is formed between the light leaving the preset surface and the light-emergent surface; the first included angle is less than the second included angle; and
the light-emergent surface of the light source is located in a first plane, a total number of all symmetry axes of a figure of the light-emergent surface is less than 3, and a total number of all symmetry axes of a figure of an orthographic projection region of the collimator on the first plane is less than 3;
wherein the light-emergent surface of the light source has an axially-symmetric shape with a first symmetry axis and a second symmetry axis, an extending direction of the first symmetry axis being different from an extending direction of the second symmetry axis;
wherein an end, close to the light source, of the collimator is a first end; and another end, away from the light source, of the collimator is a second end;
wherein surfaces of the collimator which connect the first end and the second end comprise: two first curved surfaces, two second curved surfaces and two second planes, the first curved surfaces and the second curved surfaces are bent toward outside of the collimator, the two first curved surfaces are distributed in the extending direction of the first symmetry axis, and the two second curved surfaces and the two second planes are all distributed in the extending direction of the second symmetry axis; and
wherein the two first curved surfaces are connected to the first end and the second end respectively; the two second curved surfaces are both connected to the first end, the two second planes are connected to the two second curved surfaces respectively, and are both connected to the second end, and the two first curved surfaces and the two second curved surfaces are all preset surfaces.

16. The backlight module according to claim 15, wherein the backlight module comprises a plurality of light source assemblies arranged on a light-incident side of the light guide plate in an array.

17. The backlight module according to claim 15, wherein the backlight module is a direct-type backlight module or a side-type backlight module.

18. A display device, comprising the backlight module of claim 15.

19. The display device according to claim 18, further comprising a liquid crystal display panel.

* * * * *